United States Patent
Wang et al.

(10) Patent No.: US 10,242,963 B2
(45) Date of Patent: Mar. 26, 2019

(54) SENSOR AND MANUFACTURING METHOD THEREOF

(71) Applicant: National Tsing Hua University, Hsinchu (TW)

(72) Inventors: Yu-Lin Wang, Hsinchu (TW); Chen-Pin Hsu, Hsinchu (TW); Pei-Chi Chen, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 15/097,899

(22) Filed: Apr. 13, 2016

(65) Prior Publication Data

US 2017/0248590 A1    Aug. 31, 2017

(30) Foreign Application Priority Data

Feb. 25, 2016    (TW) .............................. 105105605 A

(51) Int. Cl.
*H01L 23/00* (2006.01)
*G01D 11/24* (2006.01)
(Continued)

(52) U.S. Cl.
CPC ............ *H01L 24/32* (2013.01); *G01D 11/245* (2013.01); *H01L 21/4846* (2013.01);
(Continued)

(58) Field of Classification Search
None
See application file for complete search history.

(56) References Cited

U.S. PATENT DOCUMENTS 8,122,596 B2    2/2012  Krulevitch et al.
8,456,018 B2 *  6/2013  Park .................... H01L 24/19
                                                257/774
(Continued)

FOREIGN PATENT DOCUMENTS

CN    102468259    5/2012
CN    103589631    2/2014
(Continued)

OTHER PUBLICATIONS

"Office Action of Taiwan Counterpart Application", dated Sep. 14, 2016, p. 1-p. 5.
(Continued)

*Primary Examiner* — Telly Green
(74) *Attorney, Agent, or Firm* — J.C. Patents

(57) ABSTRACT

Provided is a manufacturing method of a sensor including the following steps. A mold having a cavity is provided. At least one chip is disposed in the cavity. The chip has an active surface and a back surface opposite to each other. The active surface faces toward a bottom surface of the cavity. A polymer material is filled in the cavity to cover the back surface of the chip. A heat treatment is performed, such that the polymer material is solidified to form a polymer substrate. A mold release treatment is performed to isolate the polymer substrate from the cavity. A plurality of conductive lines are formed on a first surface of the polymer substrate. The conductive lines are electrically connected with the chip.

10 Claims, 4 Drawing Sheets

(51) Int. Cl.
 *H01L 23/31* (2006.01)
 *H01L 21/56* (2006.01)
 *H01L 21/48* (2006.01)

(52) U.S. Cl.
 CPC ........ *H01L 21/565* (2013.01); *H01L 23/3107* (2013.01); *H01L 2224/32225* (2013.01); *H01L 2924/01013* (2013.01); *H01L 2924/01022* (2013.01); *H01L 2924/01024* (2013.01); *H01L 2924/01028* (2013.01); *H01L 2924/0132* (2013.01); *H01L 2924/01042* (2013.01); *H01L 2924/01074* (2013.01); *H01L 2924/01078* (2013.01); *H01L 2924/01079* (2013.01); *H01L 2924/0496* (2013.01); *H01L 2924/04941* (2013.01); *H01L 2924/0509* (2013.01); *H01L 2924/06* (2013.01); *H01L 2924/0635* (2013.01); *H01L 2924/0665* (2013.01); *H01L 2924/1033* (2013.01); *H01L 2924/1082* (2013.01); *H01L 2924/10253* (2013.01); *H01L 2924/10344* (2013.01); *H01L 2924/1203* (2013.01); *H01L 2924/1304* (2013.01); *H01L 2924/1306* (2013.01); *H01L 2924/13061* (2013.01); *H01L 2924/13064* (2013.01); *H01L 2924/146* (2013.01); *H01L 2924/1461* (2013.01); *H01L 2924/15747* (2013.01); *H01L 2924/20102* (2013.01); *H01L 2924/20103* (2013.01); *H01L 2924/20104* (2013.01); *H01L 2924/20105* (2013.01); *H01L 2924/20106* (2013.01)

(56) References Cited

U.S. PATENT DOCUMENTS

| | | | |
|---|---|---|---|
| 8,685,325 B2 | 4/2014 | Wang et al. | |
| 8,921,163 B2* | 12/2014 | Park | H01L 24/19 257/E21.001 |
| 8,963,318 B2* | 2/2015 | Yap | H01L 23/5384 257/676 |
| 9,508,679 B2* | 11/2016 | Ueda | H01L 24/29 |
| 9,627,324 B2* | 4/2017 | Rietzler | H01L 21/561 |
| 2009/0124025 A1 | 5/2009 | Hamilton et al. | |
| 2009/0179316 A1 | 7/2009 | Wang et al. | |
| 2011/0045466 A1* | 2/2011 | Lin | C12Q 1/6804 435/29 |
| 2011/0117702 A1* | 5/2011 | Rietzler | H01L 21/561 438/113 |
| 2012/0104625 A1* | 5/2012 | Park | H01L 24/19 257/774 |
| 2013/0267066 A1* | 10/2013 | Park | H01L 24/19 438/121 |
| 2013/0315782 A1 | 11/2013 | Huang | |
| 2014/0239497 A1* | 8/2014 | Yap | H01L 23/5384 257/738 |
| 2015/0287696 A1* | 10/2015 | Ueda | H01L 24/29 438/107 |
| 2017/0181669 A1* | 6/2017 | Lin | G01N 27/403 |

FOREIGN PATENT DOCUMENTS

| | | |
|---|---|---|
| CN | 103913489 | 6/2015 |
| TW | 201120447 | 6/2011 |
| TW | I372137 | 9/2012 |
| TW | I383144 | 1/2013 |
| TW | I521656 | 2/2016 |

OTHER PUBLICATIONS

Chang-Soo Lee et al., "Ion-Sensitive Field-Effect Transistor for Biological Sensing", Sensors, Sep. 7, 2009, 7111-7131.

Yu-Lin Wang et al, "Biosensor and Method for Analyzing Analyte Concentration in a Liquid Sample", Unpublished U.S. Appl. No. 14/873,765 , filed Oct. 2, 2015.

Hsu et al., "A novel and robust packaging technology for miniaturized FET-based biosensors with microfluidic channels," ECS Trans., May 2016, pp. 33-35.

"Office Action of China Counterpart Application", dated Nov. 20, 2018, p. 1-p. 7.

* cited by examiner

SENSOR AND MANUFACTURING METHOD THEREOF

CROSS-REFERENCE TO RELATED APPLICATION

This application claims the priority benefit of Taiwan application serial no. 105105605, filed on Feb. 25, 2016. The entirety of the above-mentioned patent application is hereby incorporated by reference herein and made a part of this specification.

BACKGROUND OF THE INVENTION

Field of the Invention

The invention relates to a sensor and a manufacturing method thereof, and particularly relates to a sensor which a chip integrated into a polymer substrate and a manufacturing method thereof.

Description of Related Art

System in package (SiP) refers to that all or most electronic functions of one system or subsystem are integrated into one substrate. For instance, the system in package may include a variety of chips, which may be bonded on the substrate in a 2D or 3D stacked manner. The chip may be a processor, a dynamic random access memory (DRAM), or a flash memory combined with other passive components (e.g., capacitors, resistors), for example. Thus, the system in package only needs to add a few external components, and the system in package can work. For the current electronic products which are increasingly miniaturized, the system in package not only has the functions of reducing the volume and weight of the package, but can reduce the power consumption.

In general, a field-effect transistor (FET) is a semiconductor device which controls the current by the electric field effect. Since the FET has advantages of small volume, light weight, low power consumption, long lifetime, etc., the range of application thereof is wider. For instance, the FET can be applied to sensors, which includes gas sensors or biosensors. However, when the FET is applied to the biosensor, the conventional silicon wafer manufacturing process requires higher cost with a lower wafer area utilization rate.

SUMMARY OF THE INVENTION

The invention provides a sensor and a manufacturing method thereof, which can integrate the chip into the polymer substrate so as to reduce the manufacturing cost, thereby improving the commercial product competitiveness.

The invention provides a manufacturing method of a sensor including the following steps. A mold having a cavity is provided. At least one chip is disposed in the cavity. The chip has an active surface and a back surface opposite to each other. The active surface faces toward a bottom surface of the cavity. A polymer material is filled in the cavity to cover the back surface of the chip. A heat treatment is performed, such that the polymer material is solidified to form a polymer substrate. A mold release treatment is performed to isolate the polymer substrate from the cavity. A plurality of conductive lines are formed on a first surface of the polymer substrate. The conductive lines are electrically connected with the chip.

According to an embodiment of the invention, after forming the conductive lines, the manufacturing method further includes forming a microchannel structure on the chip.

According to an embodiment of the invention, before forming the microchannel structure, the manufacturing method further includes forming a protective layer on the first surface of the polymer substrate. The protective layer has an opening. The opening at least exposes a sensing area of the chip.

According to an embodiment of the invention, the first surface of the polymer substrate is coplanar with the active surface of the chip.

According to an embodiment of the invention, the polymer material includes a thermosetting resin material.

According to an embodiment of the invention, the thermosetting resin material includes epoxy, polydimethylsiloxane (PDMS), poly(methyl methacrylate) (PMMA), or a combination thereof.

According to an embodiment of the invention, the chip includes a transistor chip, a surface acoustic wave chip, a diode chip, a semiconductor resistance chip, a microelectromechanical chip, or a combination thereof.

According to an embodiment of the invention, the transistor chip includes a high electron mobility transistor, a Si-based field-effect transistor, a nanowire field-effect transistor, a carbon nanotube field-effect transistor, a graphene field-effect transistor, a molybdenum disulfide field-effect transistor, or a combination thereof.

The invention provides a sensor including a polymer substrate, at least one chip, and a plurality of conductive lines. The chip is embedded in the polymer substrate. The chip has an active surface and a back surface opposite to each other. The active surface is exposed from a first surface of the polymer substrate. The conductive lines are disposed on the polymer substrate. The conductive lines are electrically connected with the chip.

According to an embodiment of the invention, the sensor further includes a microchannel structure disposed on the chip.

According to an embodiment of the invention, the first surface of the polymer substrate is coplanar with the active surface of the chip.

According to an embodiment of the invention, the chip includes a transistor chip, a surface acoustic wave chip, a diode chip, a semiconductor resistance chip, a microelectromechanical chip, or a combination thereof.

According to an embodiment of the invention, the transistor chip includes a high electron mobility transistor, a Si-based field-effect transistor, a nanowire field-effect transistor, a carbon nanotube field-effect transistor, a graphene field-effect transistor, a molybdenum disulfide field-effect transistor, or a combination thereof.

Based on the above, the chip is embedded in the polymer substrate in the invention, such that the surface of the polymer substrate is coplanar with the active surface of the chip. Next, the microchannel structure is disposed on the chip to form the sensor which combines the microchannel and the chip. The sensor can not only reduce the manufacturing cost, but also is compatible with the conventional semiconductor manufacturing process. Therefore, in the commercial market, the sensor of the invention has the product competitiveness. Additionally, the invention can integrate a variety of chips into the polymer substrate, and the chip may respectively have properties, such as gas sensing, pressure sensing, or humidity sensing, to achieve the effect of the system in package.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
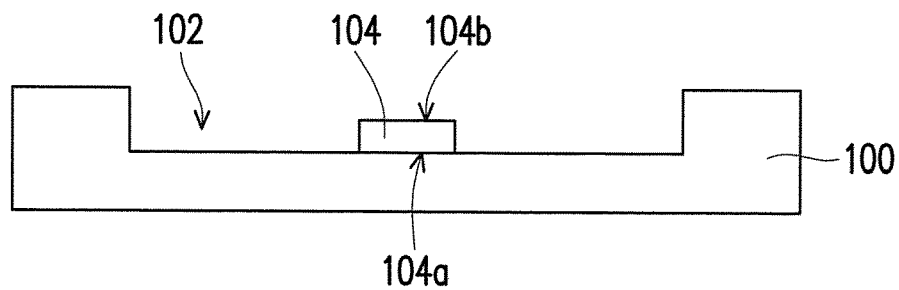
FIG. 1A to FIG. 1F are schematic views illustrating a manufacturing process of a sensor of an embodiment of the invention.

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. The same or similar reference numbers represent the same or similar components, and are not repeated again in the following paragraphs.

FIG. 1A to FIG. 1F are schematic views illustrating a manufacturing process of a sensor of an embodiment of the invention.

Referring to FIG. 1A, an embodiment of the invention provides a manufacturing method of a sensor including the following steps. First, a mold 100 having a cavity 102 is provided. In an embodiment, a material of the mold 100 may be polydimethylsiloxane (PDMS), polyacrylate, or other suitable materials, for example. The cavity 102 is recessed in a surface of the mold 100, wherein a recess depth of the cavity 102 may be less than a thickness of the mold 100. In the present embodiment, a shape of the cavity 102 may be a rectangle, for example. However, the invention is not limited thereto. In other embodiments, the shape of the cavity 102 may be a square, a circle, or a polygon, for example.

Next, a chip 104 is disposed in the cavity 102. The chip 104 has an active surface 104a and a back surface 104b opposite to each other. The active surface 104a of the chip 104 faces toward a bottom surface of the cavity 102. In an embodiment, the chip 104 may include a transistor chip, a surface acoustic wave chip, a diode chip, a semiconductor resistance chip, a microelectromechanical chip, or a combination thereof. The transistor chip may be a high electron mobility transistor (HEMT), a Si-based field-effect transistor, a nanowire field-effect transistor, a carbon nanotube field-effect transistor, a graphene field-effect transistor, a molybdenum disulfide field-effect transistor, or a combination thereof, for example. Only one chip 104 is shown in FIG. 1A; however, the invention is not limited thereto. In other embodiments, the number and type of the chip 104 can be adjusted according to the needs of users. For instance, the chip 104 may have a variety of mechanical and physical sensing properties, such as gas sensing, pressure sensing, humidity sensing, or dust sensing, for example. In the present embodiment, the chip 104 having the variety of sensing properties can be disposed in the cavity 102, such that the sensor of the embodiment may have more flexibility to meet the needs of customers or users.

Figure 1B:
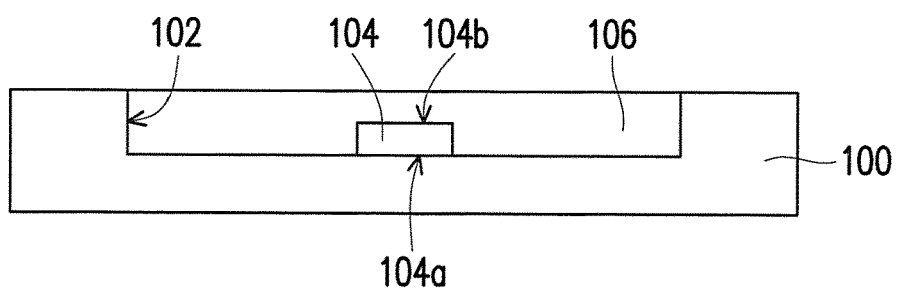

Referring to FIG. 1A and FIG. 1B, a polymer material 106 is filled in the cavity 102 to cover the back surface 104b of the chip 104. In an embodiment, the polymer material 106 includes a thermosetting resin material. The thermosetting resin material may be epoxy, polydimethylsiloxane (PDMS), poly(methyl methacrylate) (PMMA), or a combination thereof, for example. However, the invention is not limited thereto. In other embodiments, the polymer material 106 may be a material having a low thermal expansion coefficient, or a material which can withstand the temperature of the following vapor deposition process or sputtering process performed to form conductive lines, which is the scope of the invention. The polymer material 106 is completely filled in the cavity 102 in FIG. 1B; however, the invention is not limited thereto. In other embodiments, the polymer material 106 may be incompletely filled in the cavity 102. That is, as long as the polymer material 106 can cover the back surface 104b of the chip 104, such that the chip 104 is embedded in the polymer material 106, which is the scope of the invention.

Figure 1C:
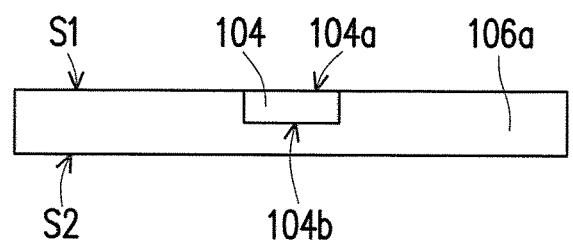

Referring to FIG. 1B and FIG. 1C, a heat treatment is performed, such that the polymer material 106 is solidified to form a polymer substrate 106a. Since the polymer material 106 may be the thermosetting resin material, for example, the polymer material 106 can be solidified to form the polymer substrate 106a in a solid state when the heat treatment is performed. At this time, the chip 104 is embedded in the polymer substrate 106a. Besides, the active surface 104a of the chip 104 is exposed from a first surface S1 of the polymer substrate 106a. In an embodiment, a temperature of the heat treatment may be 50° C. to 200° C., for example.

After that, a mold release treatment is performed to isolate the polymer substrate 106a from the cavity 102. Then, the polymer substrate 106a is inverted, such that the first surface S1 of the polymer substrate 106a faces upward, and a second surface S2 faces downward. In the present embodiment, the mold release treatment is not particularly limited. For example, the polymer substrate 106a can be isolated from the cavity 102 in a manual way directly.

Figure 1D:
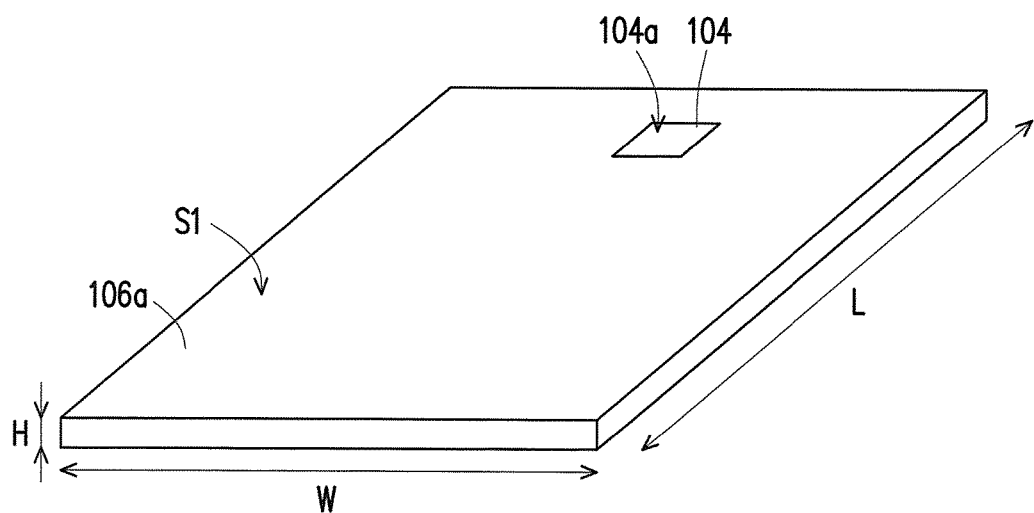

The polymer substrate 106a (or the sensor) after performing the mold release treatment is as shown in FIG. 1D. It can be regarded that the first surface S1 of the polymer substrate 106a is coplanar with the active surface 104a of the chip 104. In an embodiment, a length L of the polymer substrate 106a may be 10 mm to 50 mm, for example; a width W thereof may be 5 mm to 30 mm, for example; a height H thereof may be 0.5 mm to 2 mm, for example. However, the invention is not limited thereto, and the size of the polymer substrate 106a can be adjusted according to the needs of users. For instance, the size of the sensor of the invention can meet the size of the micro secure digital (Micro SD), the length thereof may be 20 mm, for example; the width thereof may be 10 mm, for example; the height thereof may be 0.7 mm, for example. Thus, the sensor of the invention may be consistent with the reading device of the current Micro SD to read the results of biological detection.

Figure 1E:
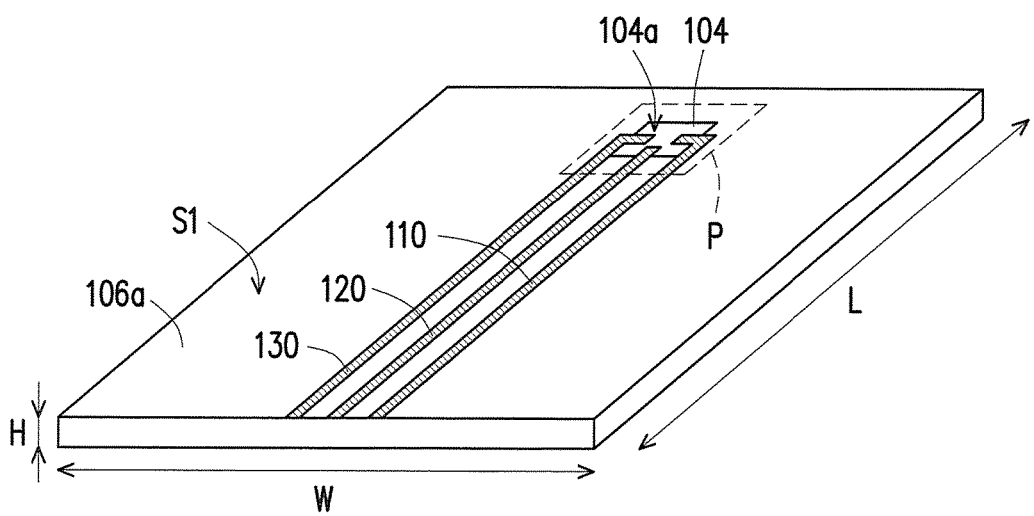

Referring to FIG. 1D and FIG. 1E, conductive lines 110, 120, and 130 are formed on the first surface S1 of the polymer substrate 106a. The conductive lines 110, 120, and 130 are electrically connected with the chip 104. In an embodiment, the conductive lines 110, 120, and 130 may be metal conductive lines, and materials of the metal conductive lines may be gold, silver, copper, or a combination thereof, for example. The materials of the conductive lines 110 and 130 may be the same or different from the material of the conductive line 120. For instance, all the materials of the conductive lines 110, 120, and 130 may be gold. In another embodiment, the materials of the conductive lines 110 and 130 may be copper, for example, and the material of the conductive lines 120 may be gold, for example. In an embodiment, a forming method of the conductive lines 110, 120, and 130 may be a lift-off process, for example. As the lift-off process is known by a person skilled in the art, it will not be repeated here.

It should be noted that, the sensor of the present embodiment can use the polymer substrate 106a to substitute the conventional silicon wafer substrate so as to reduce the manufacturing cost, thereby improving the commercial product competitiveness. Additionally, since the conductive lines 110, 120, and 130 of the sensor of the present embodiment are formed on the polymer substrate 106a, the chip 104 of the present embodiment can be effectively reduced to increase the area utilization rate of the sensor in comparison with the conventional Si-based sensor.

Figure 2:
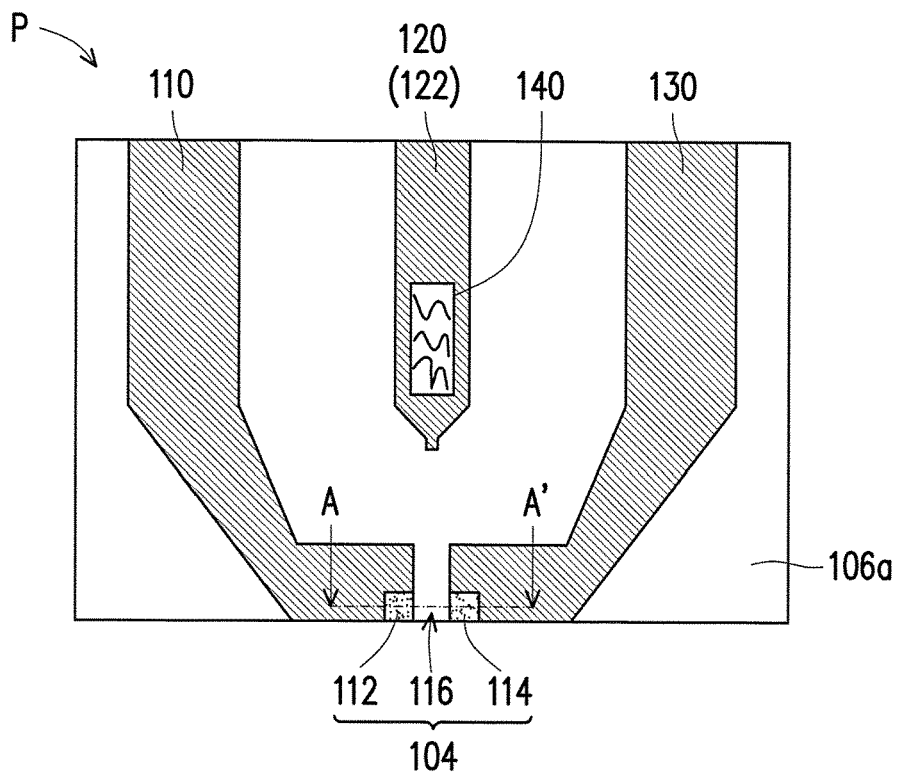
FIG. 2 is a schematic top view illustrating a part of the sensor of FIG. 1E.
Figure 3:
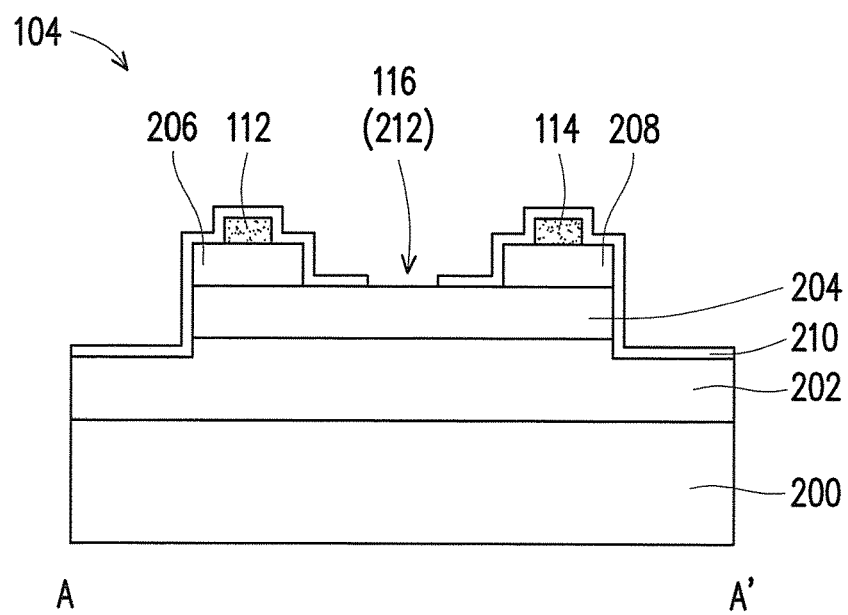
FIG. 3 is a schematic cross-sectional view along the line A-A' of FIG. 2.

FIG. 2 is a schematic top view illustrating a part of the sensor of FIG. 1E. FIG. 3 is a schematic cross-sectional view along the line A-A' of FIG. 2. For clarity of illustration, only the chip is shown in FIG. 3, while the polymer substrate is not shown; the protective layer is not shown in FIG. 2.

Referring to FIG. 1E, FIG. 2, and FIG. 3 at the same time, a part of the sensor P includes the polymer substrate 106a, the conductive lines 110, 120, and 130, and the chip 104. The chip 104 includes a source terminal 112, a drain terminal 114, and a gate terminal 116 disposed between the source terminal 112 and the drain terminal 114. As shown in FIG. 2, the conductive line 110 is electrically connected with the source terminal 112, and the conductive line 130 is electrically connected with the drain terminal 114. On the other hand, the conductive line 120 may include a reaction layer 122. The reaction layer 122 is opposite to the gate terminal 116 of the chip 104, and the reaction layer 122 (or the conductive line 120) is not electrically connected with the gate terminal 116. The reaction layer 122 has a sensing area 140 thereon, wherein the sensing area 140 includes a receptor bonded on the reaction layer 122.

Particularly, when the biological detection is performed, a test sample with a ligand being in response to the receptor is placed on the sensing area 140 (or the reaction layer 122), such that the ligand is bonded on the receptor. Then, a voltage is applied onto the reaction layer 122 of the conductive line 120, which causes a voltage difference between the reaction layer 122 and the gate terminal 116 of the chip 104 to obtain the detected current. The selection of the receptor and the ligand are not particularly limited, as long as that the ligand and the receptor on the sensor can be bonded with each other is the scope of the invention. In an embodiment, the test sample may be ribonucleic acids (RNA), deoxyribonucleic acids (DNA), enzymes, proteins, viruses, lipids, or a combination thereof, for example. However, the invention is not limited thereto.

On the other hand, as shown in FIG. 3, the high electron mobility transistor (HEMT) is used as an example to illustrate. The structure of the chip 104 is that a GaN layer 202 and a AlGaN layer 204 are sequentially formed on a sapphire substrate 200. In an embodiment, the size of the AlGaN layer 204 is smaller than that of the GaN layer 202. In other words, a part of a top surface of the GaN layer 202 is exposed. Then, ohmic contact layers 206 and 208 are respectively formed on the AlGaN layer 204, wherein the ohmic contact layers 206 and 208 are not in contact with each other. In an embodiment, materials of the ohmic contact layers 206 and 208 may be Ti, Al, Ni, Au, Cr, Mo, Pt, or a combination thereof, for example, and a forming method thereof may be a vapor deposition method or a sputtering method, for example.

After that, the source terminal 112 (may be a source electrode or an extension of the conductive line 110, for example) is formed on the ohmic contact layer 206; the drain terminal 114 (may be a drain electrode or an extension of the conductive line 130, for example) is formed on the ohmic contact layer 208. In an embodiment, materials of the source terminal 112 and the drain terminal 114 may include one or more conductive materials, and the conductive material may be a metal material, a metal compound, or a combination thereof, for example. The metal material may be Ti, Al, Ni, Au, W, or a combination thereof, for example; the metal compound may be TiN, TiW, TiWN, WN, or a combination thereof, for example. A forming method of the source terminal 112 and the drain terminal 114 may be a chemical vapor deposition method, a physical vapor deposition method, or other suitable forming methods, for example. The physical vapor deposition method may be a vapor deposition method or a sputtering method.

Then, a protective layer 210 is formed on the sapphire substrate 200 (or the first surface S1 of the polymer substrate 106a). The protective layer 210 covers surfaces of the GaN layer 202, the AlGaN layer 204, the ohmic contact layers 206 and 208, the source terminal 112, and the drain terminal 114. The protective layer 210 has an opening 212, wherein the opening 212 exposes the surface of the gate terminal 116 (as shown in FIG. 3) or the sensing area of the chip 104 (not shown). In an embodiment, a material of the protective layer 210 may be silicon nitride or photoresist, for example, and a forming method thereof may be a chemical vapor deposition method or a coating method, for example. In the present embodiment, the protective layer 210 can avoid the test sample from being in contact with the conductive lines 110, 120, and 130, which may damage the conductive lines 110, 120, and 130. Additionally, the protective layer 210 may expose the region near the end of the conductive lines 110, 120, and 130 so as to facilitate the conductive lines 110, 120, and 130 being electrically connected with the slot of the reading device.

Figure 1F:
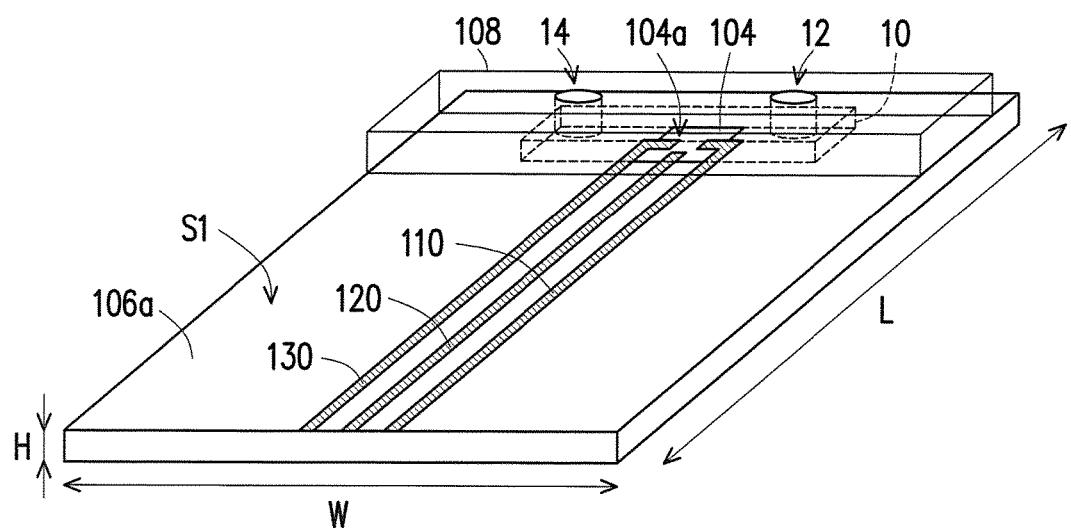

Referring to FIG. 1E and FIG. 1F, a microchannel structure 108 is formed on the chip 104. In specific, the microchannel structure 108 has a channel 10 and openings 12 and 14 disposed at two sides of the channel 10. That is, the channel 10 and the openings 12 and 14 are connected space. The channel 10 corresponds to (or exposes) the sensing area 140 of the chip 104 (as shown in FIG. 2). In an embodiment, the test sample can be in contact with the sensing area 140 of the chip 104 by the opening 12 or the opening 14 through the channel 10, such that the biological detection is performed. In an embodiment, a material of the microchannel structure 108 may be polydimethylsiloxane (PDMS), poly (methyl methacrylate) (PMMA), or a combination thereof, for example.

In another embodiment, the microchannel structure 108 only has the channel 10 but without the openings 12 and 14. In specific, in the present embodiment, the first surface S1 and the second surface S2 of the polymer substrate 106a are passed through, so as to respectively form two through vias (not shown) at two sides of the channel 10. Thereby, the channel 10 is connected with the two through vias in the polymer substrate 106a. Therefore, the test sample can be in contact with the sensing area 140 of the chip 104 by the two through vias through the channel 10, such that the biological detection is performed.

Additionally, the present embodiment is illustrated by a biosensor as an example; however, the invention is not limited thereto. In other embodiments, the sensor may have a variety of mechanical and physical sensing properties, such as gas sensing, pressure sensing, humidity sensing, or dust sensing.

In summary, the chip is embedded in the polymer substrate in the invention, such that the surface of the polymer substrate is coplanar with the active surface of the chip. Next, the microchannel structure is disposed on the chip to form the sensor which combines the microchannel and the chip. The sensor can not only reduce the manufacturing cost, but also is compatible with the conventional semiconductor manufacturing process. Therefore, in the commercial market, the sensor of the invention has the product competitiveness. Additionally, the invention can integrate a variety of chips into the polymer substrate, and the chip may respectively have properties, such as gas sensing, pressure sensing, or humidity sensing, to achieve the effect of the system in package.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a sensor used for detecting a test sample, comprising:
   providing a mold having a cavity;
   disposing at least one chip in the cavity, wherein the at least one chip has an active surface and a back surface opposite to each other, and the active surface faces toward a bottom surface of the cavity;
   filling a polymer material in the cavity to cover the back surface of the chip;
   performing a heat treatment, such that the polymer material is solidified to form a polymer substrate;
   performing a mold release treatment to isolate the polymer substrate from the cavity, so that a first surface of the polymer substrate is coplanar with the active surface of the chip;
   forming a plurality of conductive lines on the first surface of the polymer substrate, wherein the conductive lines are electrically connected with the at least one chip; and
   forming a microchannel structure on and in physical contact with the at least one chip, wherein a sensing area of the at least one chip is exposed in a channel in the microchannel structure.

2. The manufacturing method of the sensor according to claim 1, before forming the microchannel structure, further comprising forming a protective layer on the first surface of the polymer substrate, wherein the protective layer has an opening, and the opening at least exposes a sensing area of the at least one chip.

3. The manufacturing method of the sensor according to claim 1, wherein the polymer material comprises a thermosetting resin material.

4. The manufacturing method of the sensor according to claim 3, wherein the thermosetting resin material comprises epoxy, polydimethylsiloxane, poly(methyl methacrylate), or a combination thereof.

5. The manufacturing method of the sensor according to claim 1, wherein the at least one chip comprises a transistor chip, a surface acoustic wave chip, a diode chip, a semiconductor resistance chip, a microelectromechanical chip, or a combination thereof.

6. The manufacturing method of the sensor according to claim 5, wherein the transistor chip comprises a high electron mobility transistor, a Si-based field-effect transistor, a nanowire field-effect transistor, a carbon nanotube field-effect transistor, a graphene field-effect transistor, a molybdenum disulfide field-effect transistor, or a combination thereof.

7. A sensor used for detecting a test sample, comprising:
   a polymer substrate;
   at least one chip embedded in the polymer substrate, wherein the at least one chip has an active surface and a back surface opposite to each other, and the active surface is exposed from a first surface of the polymer substrate, so that the first surface of the polymer substrate is coplanar with the active surface of the chip;
   a plurality of conductive lines disposed on the polymer substrate, wherein the conductive lines are electrically connected with the at least one chip; and
   a microchannel structure disposed on and in physical contact with the at least one chip, wherein a sensing area of the least one chip is exposed in a channel in the microchannel structure.

8. The sensor according to claim 7, wherein the at least one chip comprises a transistor chip, a surface acoustic wave chip, a diode chip, a semiconductor resistance chip, a microelectromechanical chip, or a combination thereof.

9. The sensor according to claim 8, wherein the transistor chip comprises a high electron mobility transistor, a Si-based field-effect transistor, a nanowire field-effect transistor, a carbon nanotube field-effect transistor, a graphene field-effect transistor, a molybdenum disulfide field-effect transistor, or a combination thereof.

10. The sensor according to claim 7, wherein the at least one chip comprises a sensing chip having at least one sensing property, the at least one sensing property comprises gas sensing, pressure sensing, humidity sensing, or dust sensing.

* * * * *